(12) United States Patent
Chiu et al.

(10) Patent No.: US 6,281,428 B1
(45) Date of Patent: Aug. 28, 2001

(54) PHOTOVOLTAIC GENERATOR

(75) Inventors: John C. C. Chiu; Steven Lai, both of Hsin Chu (TW)

(73) Assignee: Opto Tech Corporation (TW)

( * ) Notice: Subject to any disclaimer, the term of this patent is extended or adjusted under 35 U.S.C. 154(b) by 0 days.

(21) Appl. No.: 09/453,558

(22) Filed: Dec. 3, 1999

(30) Foreign Application Priority Data

Sep. 1, 1999 (TW) .................................................. 88115156

(51) Int. Cl.⁷ ...................................................... H01L 31/00
(52) U.S. Cl. .............................................................. 136/255
(58) Field of Search .............................................. 136/255

(56) References Cited

U.S. PATENT DOCUMENTS

| | | | |
|---|---|---|---|
| 3,994,012 | * 11/1976 | Warner et al. ......................... | 136/255 |
| 4,110,122 | * 8/1978 | Kaplow et al. ........................ | 136/255 |
| 5,633,526 | * 5/1997 | Kudo et al. ............................ | 257/431 |
| 5,928,438 | * 7/1999 | Salami et al. .......................... | 136/255 |

\* cited by examiner

Primary Examiner—Mark Chapman

(57) ABSTRACT

A photovoltaic generator comprising a substrate; an insulating layer provided on the substrate; first impurity diffusion zones formed on the insulating layer; second impurity diffusion zones deep enough to reach the insulating layer and of an opposite polarity to that of the first impurity diffusion zones the second impurity diffusion zones and the first impurity diffusion zones being alternately positioned on the surface of the substrate to form substantially vertical pn junctions; third impurity diffusion zones provided on the surface of the first impurity diffusion zones and the second impurity diffusion zones opposite to the insulating layer and of the same polarity as that of the second impurity diffusion zones, one end of each of the third impurity diffusion zones connecting, to the adjacent one of the second impurity diffusion zones while the other end connecting to the adjacent one of the first impurity diffusion zones; fourth impurity diffusion zones formed on the surface of the adjacent one of the first impurity diffusion zones and the adjacent one of the second impurity diffusion zones opposite to the insulating layer and being a heavily doped impurity diffusion zones of the same polarity as that of the first impurity diffusion zones; thin-film electrodes each connecting the adjacent one of the fourth impurity diffusion zones and the adjacent one of the second impurity diffusion zones and/or the adjacent one of the third impurity diffusion zones, and isolation zones each provided between the plurality of thin-film electrodes.

19 Claims, 7 Drawing Sheets

PHOTOVOLTAIC GENERATOR

FIELD OF THE INVENTION

The present invention relates to a photovoltaic generator and, more particularly, to a photovoltaic generator with such advantages as high photoelectric conversion efficiency, low series resistance, easy circuit layout design, and feasibility of integration with other devices on the same chip without utilizing any extra photolithographic procedure for device isolation.

BACKGROUND OF THE INVENTION

A photovoltaic generator is a widely used photoelectric device that can be used not only for detecting the optical radiation but also for generating electric power from the optical radiation.

A photovoltaic generator is mainly operated in the depletion region adjacent the pn junction. When the external optical radiation impinges on the photovoltaic generator, the device internal can be excited to generate electron-hole pairs. These electron-hole pairs then will be separated by the electric field induced by the built-in potential in the depletion region, and the photogenerated current occurs. This photogenerated current can be used to drive an external circuit.

FIG. 1A is a sectional view of a typical conventional photovoltaic generator that comprises: a substrate 11, an oxide layer 12, a p-type impurity diffusion region 13, a heavily doped n-type impurity diffusion region 14, an oxide layer 15, and a metal layer 16.

In FIG. 1A, the oxide layer 12 isolates predetermined isolation regions on the top portion of the substrate 11. The p-type impurity diffusion region 13 and the heavily doped n-type impurity diffusion region 14 in each of the isolation regions form a pn junction. The metal layer 16 connects the heavily doped n-type impurity diffusion region 14 to the p-type impurity diffusion region 13 of the next pn junction. Series-connected pn junctions are formed in this way as shown in the figure. The oxide layer 15 isolates the metal layer 16 to prevent the occurrence of short circuit between the p-type impurity diffusion region 13 and the heavily doped n-type impurity diffusion region 14 within the same isolation region.

FIG. 1B is a schematic plan view of the conventional photovoltaic generator. In FIG. 1B, the numeral 17 represents a positive electrode and numeral 18 represents a negative electrode. Each square region represents an isolation region, i.e., the region containing a single pn junction. The negative electrode 18 can be connected to the positive electrode 17 of the next stage to obtain more pn junctions in series.

FIG. 1A clearly shows that each isolation region, which contains a pn junction, is isolated by an oxide layer 12. Not only does this kind of isolation have a low yield rate, but it also involves a complicated manufacturing process. In addition, it wastes much area on the surface of the silicon substrate, and thus increases the production cost.

The U.S. Pat. No. 5,633,526 discloses another photovoltaic generator that uses a silicon-on-insulator (SOI) wafer as its substrate and takes the insulating layer in the SOI wafer as the isolation. This device resolves the problems of low yield rate and high cost derived from the conventional isolation technology applied on the conventional photovoltaic generator. Nevertheless, this improved photovoltaic generator requires a complicated manufacturing procedure and does not provide a good way to increase the photoelectric conversion efficiency. Furthermore, the concentric plan structure used in this improved photovoltaic generator, as shown in FIG. 2, incurs a difficult circuit layout design and many electric application parameters, e.g. the maximal photogenerated current, are limited by the pn junction of the smallest area (i.e. the innermost pn junction). Therefore, the application purview of this prior art photovoltaic generator is limited.

Furthermore, a photovoltaic generator usually needs to be used together with some external circuits. In the prior art, if the photovoltaic generator and some circuit devices are to be integrated into a single chip, extra isolation procedures are needed for the isolation between the devices in addition to the respective manufacturing procedures of the photovoltaic generator and these circuit devices. Therefore, the number of manufacturing procedures increases.

SUMMARY OF THE INVENTION

An object of the present invention is to provide a photovoltaic generator that has high photoelectric conversion efficiency and does not require a complicated manufacturing procedure.

Another object of the invention is to provide a photovoltaic generator that is easy to control and design in a plan circuit layout.

Yet another object of the invention is to provide a photovoltaic generator that can be integrated with other devices within the same chip without the need of an extra photolithographic procedure to isolate them.

The present invention provides a photovoltaic generator comprising a substrate; an insulating layer provided on the substrate; a plurality of first impurity diffusion zones formed on the insulating layer; a plurality of second impurity diffusion zones deep enough to reach the insulating layer and of an opposite polarity to that of the first impurity diffusion zones, the second impurity diffusion zones and the first impurity diffusion zones being alternately positioned on the surface of the substrate to form a plurality of substantially vertical pn junctions; a plurality of third impurity diffusion zones provided on the surface of the first impurity diffusion zones and the second impurity diffusion zones opposite to the insulating layer and of the same polarity as that of the second impurity diffusion zones, one end of each of the third impurity diffusion zones connecting to the adjacent one of the second impurity diffusion zones while the other end connecting to the adjacent one of the first impurity diffusion zones so that the third impurity diffusion zone strides over one of the plurality of vertical pn junctions; a plurality of fourth impurity diffusion zones formed on the surface of the adjacent one of the first impurity diffusion zones and the adjacent one of the second impurity diffusion zones opposite to the insulating layer and being a heavily doped impurity diffusion zones of the same polarity as that of the first impurity diffusion zones, each of the fourth impurity diffusion zones connecting to the adjacent one of the first impurity diffusion zones without contact with the adjacent one of the third impurity diffusion zones that connects to the same one of the first impurity diffusion zones and striding over at most one of the plurality of vertical pn junctions; a plurality of thin-film electrodes each connecting the adjacent one of the fourth impurity diffusion zones and the adjacent one of the second impurity diffusion zones and/or the adjacent one of the third impurity diffusion zones on the adjacent one of the second impurity diffusion zones; and a plurality of isolation zones each provided between the plurality of thin-film electrodes.

Furthermore, each of the third impurity diffusion zones that extends to the adjacent one of the first impurity diffusion zones can increase both the area of the pn junction and the photoelectric conversion efficiency.

Moreover, to increase the optical radiation absorption rate, the height of the first and second impurity diffusion zones on the substrate are increased in the vertical direction. However, due to the manufacturing consideration of the second impurity diffusion zones, heavily doped impurity diffusion zones are necessary.

In accordance with a preferred embodiment of the invention, the first impurity diffusion zones and the second impurity diffusion zones are linearly deployed in a parallel photovoltaic generator structure that is fairly easy to design for circuit layout designers.

The above-mentioned linear parallel photovoltaic generator array takes advantage of the mesa structure formed on the peripheral region for isolation. Not only is this manufacturing process easier but it also increases the production yield.

Moreover, the photovoltaic generator array is integrated with other electric devices. The isolation among devices can be achieved in the same step by which the junctions of the second impurity diffusion zones are formed to lower the cost.

BRIEF DESCRIPTION OF THE DRAWINGS

The above and other objects and the features and effects of the present invention can be best understood by referring to the following detailed description of a preferred embodiment and the accompanying drawings, in which.

DETAILED DESCRIPTION OF THE PREFERRED EMBODIMENT

The operation and production method of a photovoltaic generator in accordance with a preferred embodiment of the invention will be explained detailedly in conjunction with the accompanying drawings.

Figure 3:
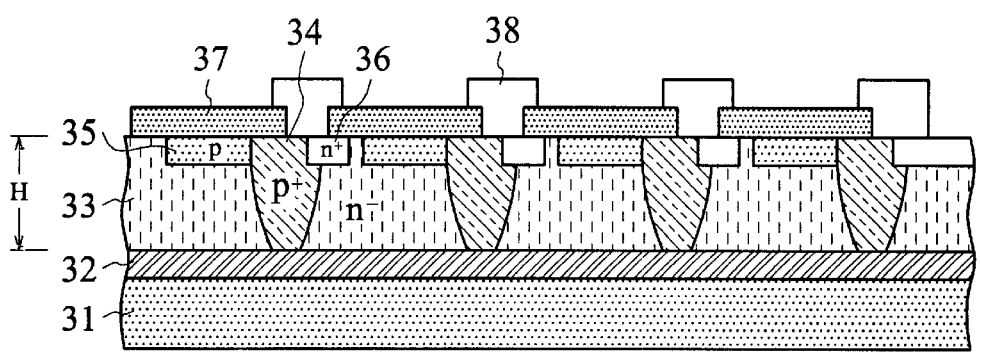
FIG. 3 is a sectional view showing the structure of a photovoltaic generator in accordance with a preferred embodiment of the invention.

Referring to FIG. 3, a photovoltaic generator in accordance with a preferred embodiment of the invention comprises: a substrate 31; an insulating layer 32 formed on the substrate 31; a plurality of $n^-$ impurity diffusion zones 33 formed on the insulating layer 32; a plurality of $p^+$ impurity diffusion zones 34 formed on the insulating layer 32 so that a plurality of pn junctions substantially in the vertical direction are formed between the $n^-$ impurity diffusion zones 33 and the $p^+$ impurity diffusion zones 34; a plurality of p impurity diffusion zones 35 each connecting with an adjacent $p^+$ impurity diffusion zone 34 and an adjacent $n^-$ impurity diffusion zone; a plurality of $n^+$ impurity diffusion zones 36 each connecting with an adjacent $n^-$ impurity diffusion zone 33; and a plurality of isolation zones 37; and a plurality of thin-film electrodes 38 for connecting the pn junctions in series, every two of the thin-film electrodes 38 being separated by one of the isolation zones 37.

Figure 1A:
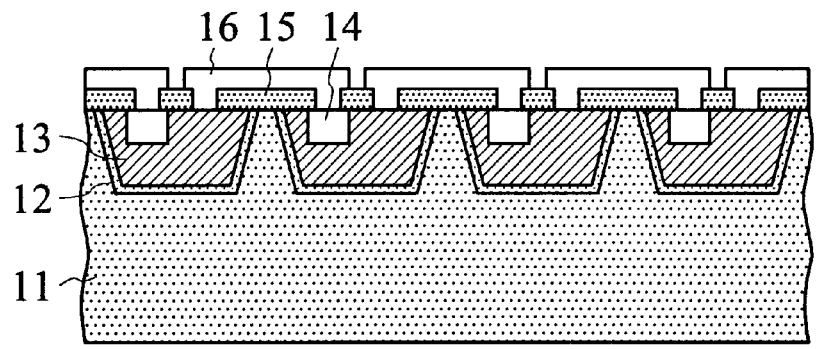
FIG. 1A is a sectional view of a conventional photovoltaic generator.
Figure 1B:
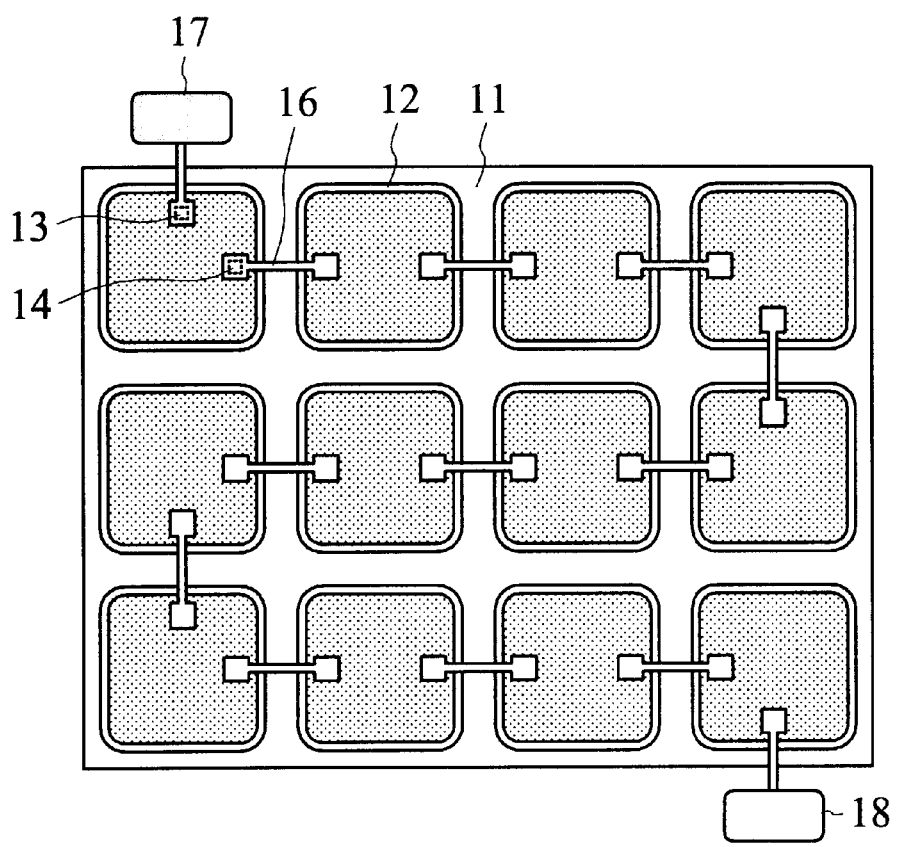
FIG. 1B is a schematic plan view of the photovoltaic generator.

In accordance with a preferred embodiment of the invention, a plan oxide layer of the SOI wafer is used as the isolating layer 32, replacing the oxide layer 12 utilized in the prior art photovoltaic generator shown FIG. 1A and FIG. 1B, to resolve the problems of low yield and high production cost. Moreover the isolating layer of the photovoltaic generator in accordance with the preferred embodiment of the invention is below the wafer surface, leaving the wafer surface intact. Therefore, both the area occupied by the isolating layer as shown in FIG. 1A and the production cost are saved. Furthermore, this invention makes use of serially connected transverse photovoltaic generators.

On the other hand, one particular feature of the invention is that to make the most of the energy of the incident optical radiation, it utilizes a structure which can efficiently increase the absorption rate of the incident optical radiation to improve the photoelectric conversion efficiency.

Referring to FIG. 3, each of the p impurity diffusion zones 35 is in an extended form to increase the corresponding pn junction area (i.e., aside from the area of the pn junction formed by a $p^+$ impurity diffusion zone 34 and the adjacent $n^-$ impurity diffusion zone 33, the pn junction area formed by the p impurity diffusion zone 35 and the adjacent $n^-$ impurity diffusion zone 33 is enlarged). At the same time, to expand the volume of the depletion region around the pn junction so as to raise the photoelectric conversion efficiency, a lowly doped $n^-$ impurity diffusion zone is employed to increase the depletion width. In addition, different from the prior art photovoltaic generator is that the p impurity diffusion zone 35 by the shallow junction is not heavily doped so as to expand the depletion width and promote the photoelectric conversion efficiency for the same reason as above.

For example, the quantum efficiency of the silicon reaches its maximum of almost 100% when the light wavelength is in the range of 0.8 to 1.0 micrometers. Nevertheless, the absorption coefficient of the silicon lowers to the range of $10^2$ to $10^3 cm^{-1}$ with respect to the same wavelength range. Namely, even if the thickness of the silicon is 10 micrometers, more than 40% or even as much as 90% of the radiation energy cannot be absorbed. To overcome this disadvantage, the silicon thickness, indicated by "H" in FIG. 3, is increased up to 40 micrometers. Under such condition, not only can the incident optical radiation be more efficiently absorbed in the thicker silicon, the pn junction between the n⁻ impurity diffusion zones 33 and the p⁺ impurity diffusion zones 34 can be enlarged as well. Therefore, the photoelectric conversion efficiency can be greatly increased.

Nonetheless, to thicken the silicon that can more effectively absorb the optical radiation and at the same time to make the impurity diffusion zones deep enough to reach the insulating layer 32, though the heavily doped impurity diffusion zones decrease the depletion region formed with the n⁻ impurity diffusion zones 33 and thus decrease the photoelectric conversion efficiency, high concentration ion implantation is necessary to be utilized in forming the p⁺ impurity diffusion zones 34.

Despite that the p⁺ impurity diffusion zones 34 decrease the pn junction areas formed with the n⁻ impurity diffusion zones 33, it has yet another advantage. For each of the metal-semiconductor contacts between the thin-film polarization electrodes 38 and the p⁺ impurity diffusion zones 34, a heavily doped p⁺ impurity diffusion zone 34 allows this contact to effectively form an ohmic contact and helps in lowering the whole series resistance.

Similarly, the photovoltaic generator in accordance with the preferred embodiment also uses a plurality of n⁺ impurity diffusion zones 36 to form the ohmic contacts with the plurality of thin-film electrodes 38 respectively. With the above-mentioned ohmic contacts between the p⁺ impurity diffusion zones 34 and the thin-film electrodes 38, it is obvious that the whole series resistance of the photovoltaic generator in accordance with the embodiment is fairly small.

Figure 4:
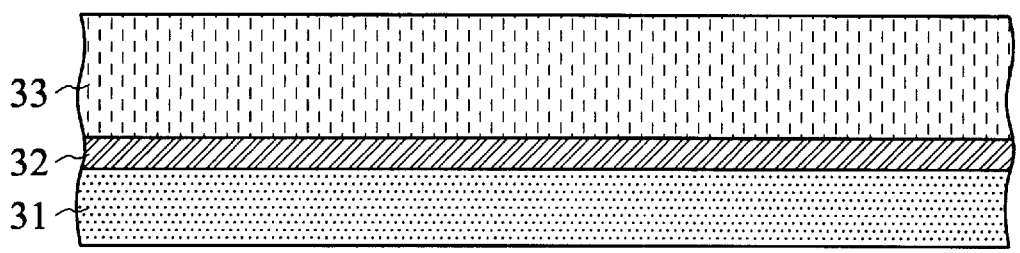
FIG. 4 is a sectional view illustrating a manufacturing stage of the photovoltaic generator.
Figure 5:
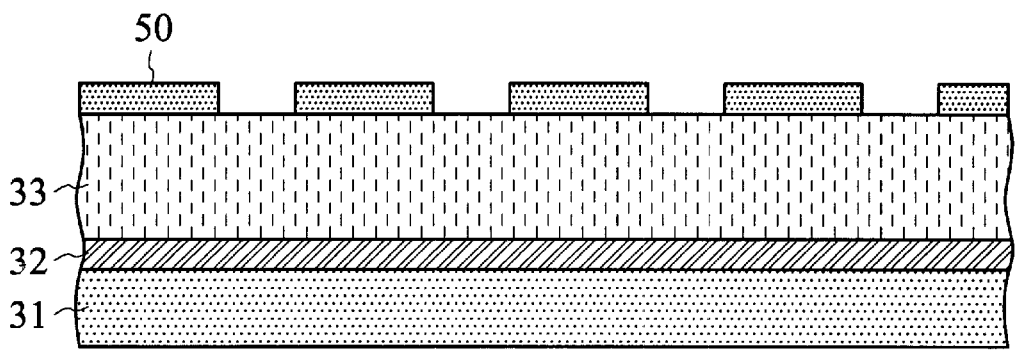
FIG. 5 is another sectional view illustrating a manufacturing stage subsequent to that illustrated by FIG. 4 of the photovoltaic generator.
Figure 6:
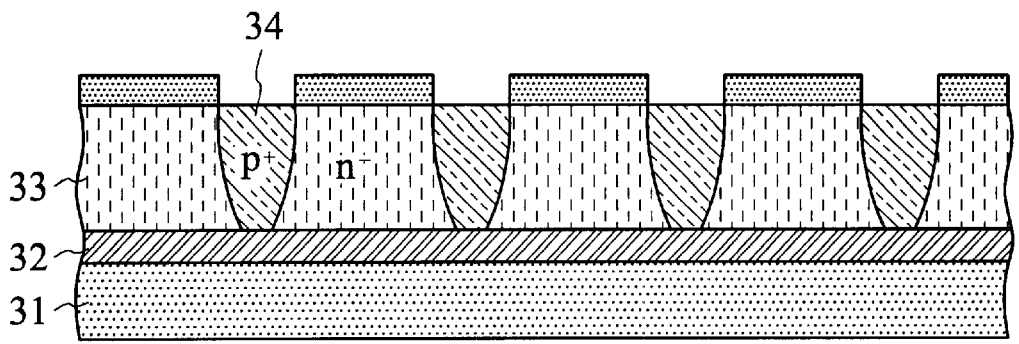
FIG. 6 is another sectional view illustrating a manufacturing stage subsequent to that illustrated by FIG. 5 of the photovoltaic generator.
Figure 7:
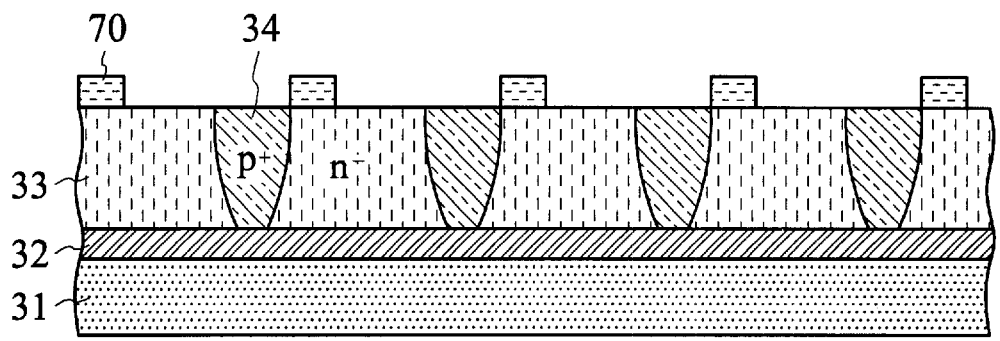
FIG. 7 is another sectional view illustrating a manufacturing stage subsequent to that illustrated by FIG. 6 of the photovoltaic generator.
Figure 8:
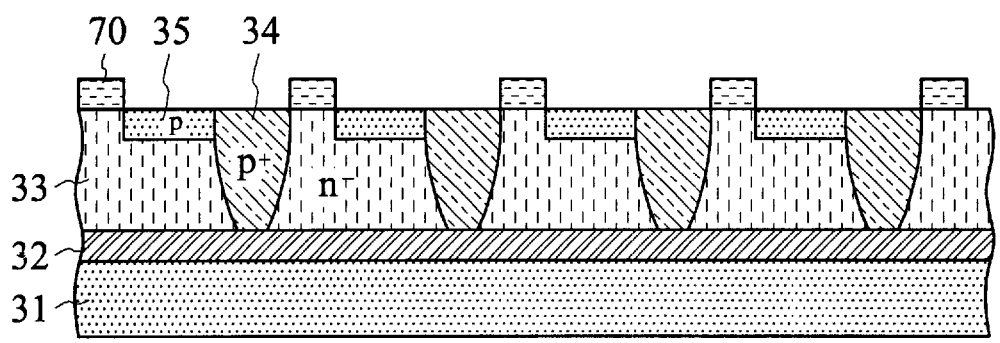
FIG. 8 is another sectional view illustrating a manufacturing stage subsequent to that illustrated by FIG. 7 of the photovoltaic generator.
Figure 9:
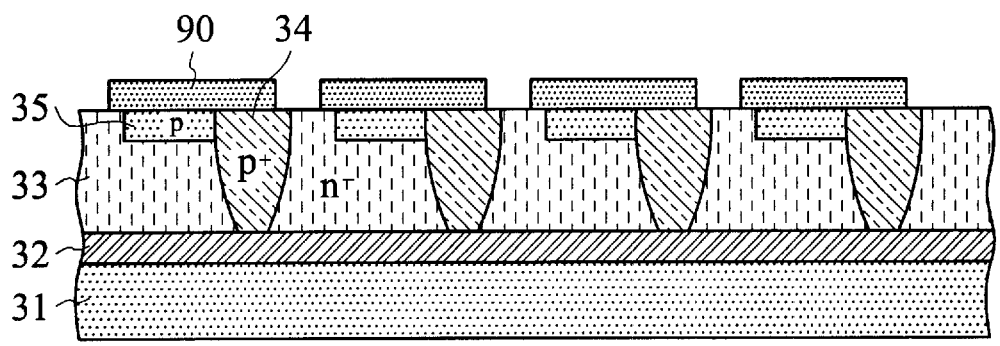
FIG. 9 is another sectional view illustrating a manufacturing stage subsequent to that illustrated by FIG. 8 of the photovoltaic generator.
Figure 10:
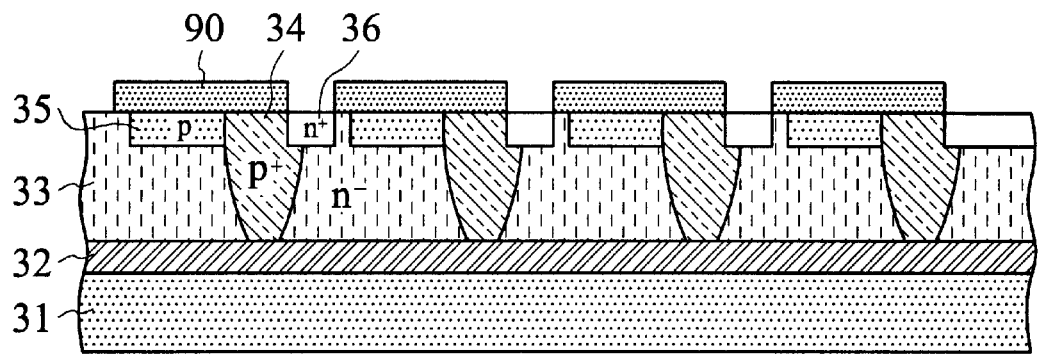
FIG. 10 is another sectional view illustrating a manufacturing stage subsequent to that illustrated by FIG. 9 of the photovoltaic generator.
Figure 11:
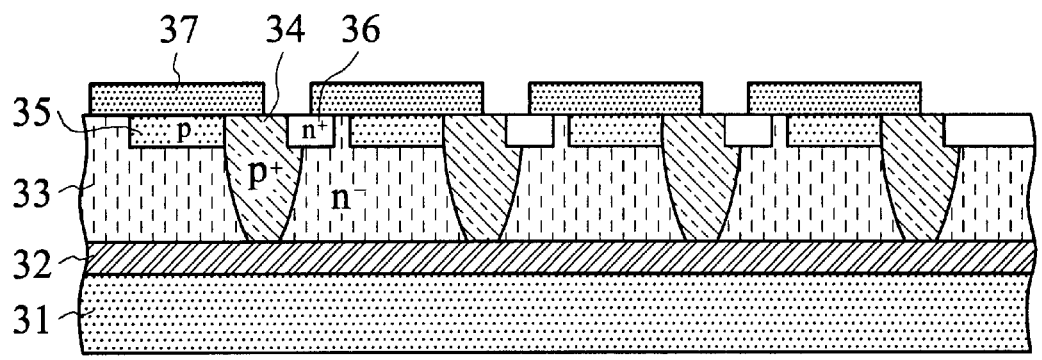
FIG. 11 is another sectional view illustrating a manufacturing stage subsequent to that illustrated by FIG. 10 of the photovoltaic generator.

FIGS. 4 to 11 illustrates the manufacturing process of the photovoltaic generator in accordance with the invention. The manufacturing process comprises the steps of: polishing the surface of the n⁻ impurity doped SOI wafer to the predetermined thickness and cleaning the surface of the wafer, as illustrated by FIG. 4; defining the regions of the p⁺ impurity diffusion zones 34 with oxide areas 50 by a first photolithographic step, as illustrated by FIG. 5; applying a high concentration ion implantation to generate the p⁺ impurity diffusion zones 34, as illustrated by FIG. 6; defining the regions of the p impurity diffusion zones with an oxide areas 70 by a second photolithographic step, as illustrated by FIG. 7; forming the p impurity diffusion zones 35 by an ion implantation step, as illustrated by FIG. 8; defining the regions of the n⁺ impurity diffusion zones 36 with oxide areas 90 by a third photolithographic step, as illustrated by FIG. 9; forming the n⁺ impurity diffusion zones 36 by an ion implantation step, as illustrated by FIG. 10; forming the isolation zones 37 by a fourth photolithographic step, as illustrated by FIG. 11; and plating a thin-film metal in each of the grooves between the isolation zones 37 and thus forming a photovoltaic generator in accordance with the preferred embodiment of the invention as shown in FIG. 3.

The foregoing describes the improvement on the cross-sectional structure of a photovoltaic generator in accordance with the preferred embodiment of the invention. Nevertheless the plan configuration of a photovoltaic generator in accordance with the preferred embodiment of the invention is improved as well.

Figure 2:
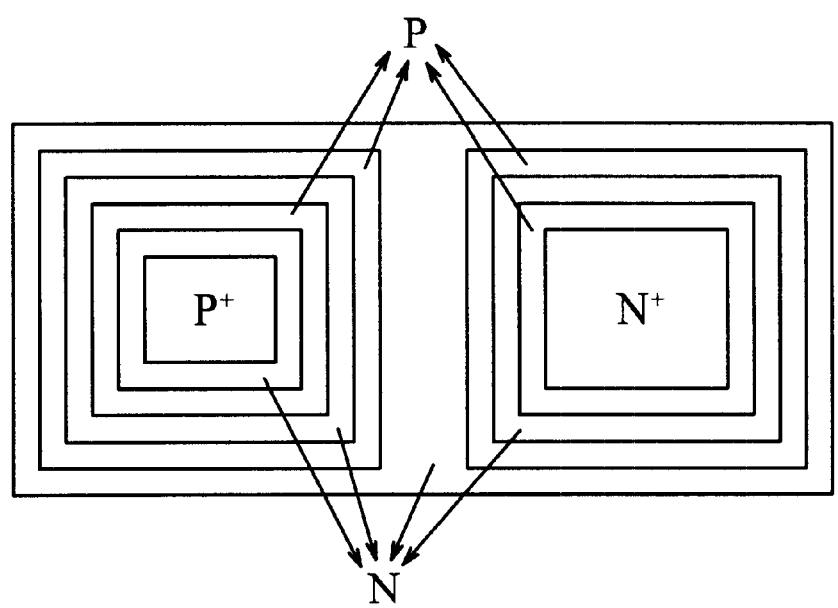
FIG. 2 is a plan view of another conventional photovoltaic generator.
Figure 12:
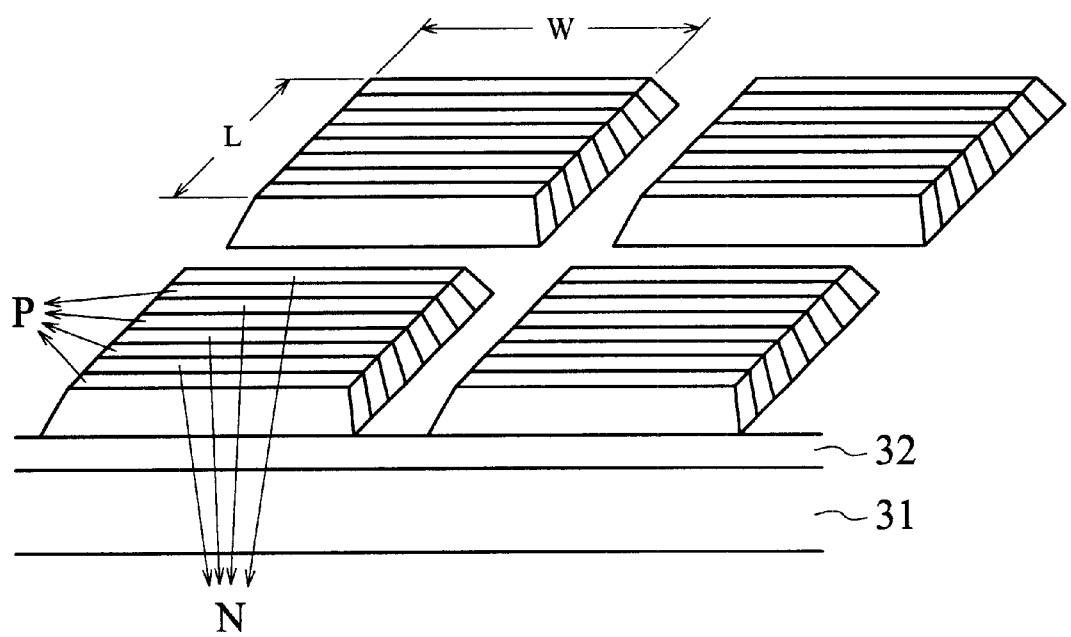
FIG. 12 is a schematic pictorial view of a photovoltaic generator in accordance with a preferred embodiment of the invention.

Referring to FIG. 12, a photovoltaic generator in accordance with the preferred embodiment of the invention takes the configuration of a linear parallel array that is different from the related prior art as illustrated in FIG. 2. A major advantage of the linear array lies in that no change is necessary to be made in the cross-sectional structure, and only the aspect ratio (namely, the ratio of L to W in FIG. 12) on the plane is varied to adjust the pn junction areas and the number of pn junctions in series. This is particularly convenient for the circuit layout designers to control each of application parameters.

Furthermore, the isolation in the photovoltaic generator in accordance with the preferred embodiment of the invention is quite different from that of the related prior art. In the prior art photovoltaic generator as shown in FIG. 1B, pn junction semiconductor layers, dielectric layers, and wiring metal layers are formed in sequence after all the isolation layers (including the isolation layers of each pn junction regions, namely, the oxide layers 12) are formed. However, to obtain a photovoltaic generator array in accordance with the preferred embodiment of the invention. The aforementioned photovoltaic generator structure is completed before forming the mesa structure on the peripheral region of each of the chips to be obtained for isolating the chip, as illustrated in FIG. 12.

According to the above comparison, the chip isolation of the invention has several advantages. First, in view of the structure of an photovoltaic generator array in accordance with the invention, isolations are only formed in the peripheral region and thus can save much area; second, in view of the manufacturing process, the structure of the present invention is relatively simple and can effectively increase the yield.

Besides, another feature of the photovoltaic generator array in accordance with the preferred embodiment lies in that it can be integrated with other devices in a single chip without the need of any extra photolithographic step for isolating the devices. In the steps illustrated in FIGS. 4 to 6, in addition to forming the p⁺ impurity diffusion zones, the same step can be applied to isolate the junctions of circuit devices. In other words, the p⁺ impurity diffusion zones and the isolation zones for junction isolation can be done within the same step.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A photovoltaic generator comprising:

a substrate;

an insulating layer provided on said substrate;

a plurality of first impurity diffusion zones formed on said insulating layer;

a plurality of second impurity diffusion zones deep enough to reach said insulating layer and of an opposite polarity to that of said first impurity diffusion zones, said second impurity diffusion zones and said first impurity diffusion zones being alternately positioned on the surface of said substrate to form a plurality of substantially vertical pn junctions;

a plurality of third impurity diffusion zones provided on the surface of said first impurity diffusion zones and said second impurity diffusion zones opposite to said insulating layer and of the same polarity as that of said second impurity diffusion zones, one end of each of said third impurity diffusion zones connecting to the adjacent one of said second impurity diffusion zones while the other end connecting to the adjacent one of said first impurity diffusion zones so that the third impurity diffusion zone strides over one of said plurality of vertical pn junctions;

a plurality of fourth impurity diffusion zones formed on the surface of the adjacent one of said first impurity diffusion zones and the adjacent one of said second impurity diffusion zones opposite to said insulating layer and being a heavily doped impurity diffusion zones of the same polarity as that of said first impurity diffusion zones each of said fourth impurity diffusion zones connecting to the adjacent one of said first impurity diffusion zones without contact with the adjacent one of said third impurity diffusion zones that connects to the same one of said first impurity diffusion zones and striding over at most one of said plurality of vertical pn junctions;

a plurality of thin-film electrodes each connecting the adjacent one of said fourth impurity diffusion zones and the adjacent one of said second impurity diffusion zones and/or the adjacent one of said third impurity diffusion zones on the adjacent one of said second impurity diffusion zones; and a plurality of isolation zones each provided between said plurality of thin-film electrodes.

2. The photovoltaic generator of claim 1, wherein said first impurity diffusion zones are p-type impurity diffusion zones and said second impurity diffusion zones are n-type impurity diffusion zones.

3. The photovoltaic generator of claim 1, wherein said first impurity diffusion zones are n-type impurity diffusion zones and said second impurity diffusion zones are p-type impurity diffusion zones.

4. The photovoltaic generator of claim 1, wherein said second impurity diffusion zones are heavily doped impurity diffusion zones to form ohmic contacts with said thin-film electrodes.

5. The photovoltaic generator of claim 4, wherein said first impurity diffusion zones and said second impurity diffusion zones are alternately positioned in a linear parallel photovoltaic generator array.

6. The photovoltaic generator of claim 1, wherein said second impurity diffusion zones are heavily doped impurity diffusion zones so as to enlarge the thickness of said first impurity diffusion zones and said second impurity diffusion zones in the direction perpendicular to said substrate.

7. The photovoltaic generator of claim 6, wherein said first and said second impurity diffusion zones have a height in the range of 10 to 40 micrometers in the direction perpendicular to said substrate.

8. The photovoltaic generator of claim 6, wherein said first and said second impurity diffusion zones have a height in the range of 10 to 25 micrometers in the direction perpendicular to said substrate.

9. The photovoltaic generator of claim 6, wherein said first and said second impurity diffusion zones have a height in the range of 25 to 40 micrometers in the direction perpendicular to said substrate.

10. The photovoltaic generator of claim 6, wherein said first impurity diffusion zones and said second impurity diffusion zones are alternately positioned in a linear parallel photovoltaic generator array.

11. The photovoltaic generator of claim 1, wherein said first and said second impurity diffusion zones have a height in the range of 10 to 40 micrometers in the direction perpendicular to said substrate.

12. The photovoltaic generator of claim 1, wherein said first and said second impurity diffusion zones have a height in the range of 10 to 25 micrometers in the direction perpendicular to said substrate.

13. The photovoltaic generator of claim 1, wherein said first and said second impurity diffusion zones have a height in the range of 25 to 40 micrometers in the direction perpendicular to said substrate.

14. The photovoltaic generator of claim 1, wherein said first impurity diffusion zones and said second impurity diffusion zones are alternately positioned in a linear parallel photovoltaic generator array.

15. The photovoltaic generator of claim 14, wherein said parallel photovoltaic generator array utilizes the mesa structure formed on the peripheral region as the isolation.

16. The photovoltaic generator of claim 14, wherein said photovoltaic generator is integrated with other electronic devices with the isolation of said other electronic devices achieved by the junction isolation technology.

17. The photovoltaic generator of claim 16, wherein the junctions of said junction isolation technology and the junctions of said second impurity diffusion zones are formed in the same manufacturing step.

18. The photovoltaic generator of claim 1, wherein said photovoltaic generator is integrated with other electronic devices with the isolation of said other electronic devices achieved by the junction isolation technology.

19. The photovoltaic generator of claim 18, wherein the junctions of said junction isolation technology and the junctions of said second impurity diffusion zones are formed in the same manufacturing step.

* * * * *